United States Patent
Sasaki et al.

(10) Patent No.: US 7,270,398 B2
(45) Date of Patent: Sep. 18, 2007

(54) CIRCUIT BOARD AND LIQUID DISCHARGING APPARATUS

(75) Inventors: Keiichi Sasaki, Kanagawa (JP); Masato Kamiichi, Kanagawa (JP); Ershad Ali Chowdhury, Kanagawa (JP); Yukihiro Hayakawa, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 364 days.

(21) Appl. No.: 10/968,901

(22) Filed: Oct. 21, 2004

(65) Prior Publication Data
US 2005/0078152 A1 Apr. 14, 2005

Related U.S. Application Data

(62) Division of application No. 10/805,191, filed on Mar. 22, 2004, now Pat. No. 6,838,351.

(30) Foreign Application Priority Data
Mar. 31, 2003 (JP) .............................. 2003-096675

(51) Int. Cl.
*B41J 2/05* (2006.01)
(52) U.S. Cl. ............................ 347/50; 347/58; 347/59; 347/63; 347/64
(58) Field of Classification Search ............. 428/209; 347/62, 50, 58–59, 63–64
See application file for complete search history.

(56) References Cited

U.S. PATENT DOCUMENTS

| 4,968,992 A | * | 11/1990 | Komuro | 347/64 |
| 5,376,231 A | | 12/1994 | Matsumoto et al. | 156/656 |
| 6,382,775 B1 | * | 5/2002 | Kubota et al. | 347/62 |
| 6,513,913 B2 | * | 2/2003 | Schulte et al. | 347/63 |
| 6,784,530 B2 | | 8/2004 | Sugaya et al. | 257/686 |
| 6,838,351 B2 | * | 1/2005 | Sasaki et al. | 438/382 |
| 6,964,471 B2 | * | 11/2005 | Tamura et al. | 347/62 |

FOREIGN PATENT DOCUMENTS

| JP | 4-320849 | 11/1992 |
| JP | 4-320850 | 11/1992 |

* cited by examiner

*Primary Examiner*—Cathy Lam
(74) *Attorney, Agent, or Firm*—Fitzpatrick, Cella, Harper & Scinto

(57) ABSTRACT

A circuit board for a liquid discharging apparatus in which coating performance of a protective layer and a cavitation resistive film on a heat generating element is excellent and durability is excellent and a manufacturing method of such a circuit board are provided. A surface portion of a wiring material layer is processed so that an etching speed of the surface portion is made higher than that of the material forming the wiring material layer. It is desirable to execute a process for forming at least one selected from a fluoride, a chloride, and a nitride of the material forming the wiring material layer into the surface portion of the wiring material layer.

3 Claims, 9 Drawing Sheets

CIRCUIT BOARD AND LIQUID DISCHARGING APPARATUS

This application is a division of application Ser. No. 10/805,191, filed Mar. 22, 2004 now U.S. Pat. No. 6,838,351, which is incorporated herein by reference.

BACKGROUND OF THE INVENTION

1. Field of the Invention

The invention relates to a circuit board on which a plurality of heat generating elements have been formed and a manufacturing method of such a circuit board. More particularly, the invention relates to a circuit board for a liquid discharging apparatus which converts an electric energy into a thermal energy by heat generating elements and discharges a liquid by using the thermal energy and a manufacturing method of such a circuit board.

2. Related Background Art

A manufacturing method of a conventional circuit board will be described hereinbelow with respect to an ink jet head as an example.

In an ink jet recording apparatus, ink is discharged as a micro liquid droplet from a discharge port onto a material to be recorded, so that an image can be recorded. Its principle will now be described. An electric energy is converted into a thermal energy by a heat generating element and a bubble is generated in the ink by the thermal energy. The liquid droplet is discharged from the discharge port existing in a front edge portion of a liquid discharge head by the operation of the bubble and deposited onto the material to be recorded, so that the image is recorded. Therefore, such a liquid discharge head has a circuit board on which a plurality of heat generating elements each for converting the electric energy into the thermal energy have been formed.

Specifically, after a resistor layer and an electrode material layer were formed onto an insulative surface, a part of the electrode material layer is removed, a pair of electrodes are formed, and an interval between the electrodes becomes a heat generating portion. After that, a protective layer to protect them against the ink and a cavitation resistive film to protect the protective layer against a chemical or physical damage accompanied by heat generation are formed.

In such a construction, there is a case where a step coverage of edge portions of the electrodes to form the heat generating portion deteriorates. It is schematically shown in FIG. 7. A resistor layer 62 of TaSiN or the like is formed on an oxide layer 61 of $SiO_2$ on an Si substrate. Although a wiring layer 63 of, for example, Al is formed on the resistor layer 62, a portion without Al exists on a part of the resistor layer 62. The portion without Al is a heat generating portion 64 of the heat generating element. A protective layer 65 consisting of P-SiN (SiN film formed by a plasma CVD) or the like to protect those layers against the ink and a cavitation resistive film 66 consisting of Ta or the like to protect the protective layer 65 against the chemical or physical damage accompanied by the heat generation are formed on those layers.

The circuit board for the liquid discharging apparatus has a plurality of heat generating elements as mentioned above at a high density, thereby enabling an image to be recorded. Each heat generating element is serially connected to power transistors (not shown) for on/off controlling a current flowing in the heat generating element. Discharge ports are formed on the circuit board and become the liquid discharging apparatus.

To solve the above problems, as disclosed in Japanese Patent Application Laid-Open Nos. H4-320849 or H4-320850, a method of providing a taper shape for edge portions of a pair of electrodes which the heat generating element has been developed.

According to such a method, even in the edge portions of a pair of electrodes which the heat generating element has, coating performance of the protective layer and the cavitation resistive film can be improved. A manufacturing method of the circuit board including a forming method of the taper shape portions of the pair of electrodes which the heat generating element has will be described hereinafter.

FIG. 6 shows a flow for a manufacturing process of the circuit board. FIG. 5A shows a cross sectional view of peripheral portions of a heat generating element of the manufactured circuit board. First, an Si wafer is used as a substrate and an oxide layer 41 of $SiO_2$ having a thickness of about a few µm is formed on the Si wafer by a thermal oxidation process. A resistor material layer of TaSiN or the like having a thickness of about 50 nm is formed on the oxide layer 41 by sputtering. After that, for example, an Al film having a thickness of about 200 nm is formed and an electrode material layer is formed. A resist layer (I) is formed on the electrode material layer and patterned. Thereafter, Al and the resistor material layer are dry-etched by using an RIE or the like, thereby separating the element and forming a wiring 43 and a resistor layer 42. After the resist layer (I) was removed by $O_2$ ashing, a resist layer (II) is formed and patterned. Thereafter, Al of a portion serving as a resistor portion 44 of the heat generating element is removed by wet etching. At this time, by using an organic alkali etchant comprising a tetramethylammonium hydroxide (hereinafter, abbreviated to TMAH) as a main component or an acid etchant comprising a phosphoric acid as a main component as a wet etchant, an edge portion of the resist layer (II) is etched and while it is moved backward, Al is etched. Thus, edge portions of a pair of electrodes which are formed become a taper shape. Subsequently, a protective layer 45 consisting of SiN and having a thickness of about 300 nm is formed by a plasma CVD method. A Ta film 46 is formed by sputtering. By removing unnecessary portions of the Ta film 46 by dry etching, a circuit board is obtained.

However, in recent years, the realization of high fineness of printing has been further progressed and a discharge quantity of the ink per discharging operation is decreasing from tens of pl to a few pl. The realization of a high speed of printing is also strongly demanded. To reduce the reciprocating motion of the liquid discharge head, a long circuit board has been realized. Therefore, the number of heat generating elements per circuit board has been increased from hundreds to thousands. In such a situation, also in the forming method of the pair of electrodes in the foregoing taper shape, such a problem that a slight fluctuation occurs in the taper shape and the coating performance of the protective layer and the cavitation resistive film on a part of the heat generating elements deteriorates occurs.

It is, therefore, an object of the invention to provide a circuit board for a liquid discharging apparatus in which coating performance of a protective layer and a cavitation resistive film on a heat generating element is excellent and durability is excellent and to provide a manufacturing method of such a circuit board.

SUMMARY OF THE INVENTION

It has been found out that the foregoing problem occurs by the following reasons. That is, an incinerated substance of a resist layer, an Al compound of a deposit upon etching, or the like remains on the surface of an electrode material layer obtained after the resist layer (I) was removed, or an oxide of a material forming the electrode material layer is formed, and they remain as a structure like a hook 49 at the time of a wet etching process which is executed after that, so that coating performance of a protective layer and a cavitation resistive film is deteriorated by it (refer to FIG. 5B). Therefore, it has been found out that the above problem can be solved by processing the surface portion of the electrode material layer so that an etching speed is made higher than that of the material forming the electrode material layer.

That is, according to the invention, there is provided a manufacturing method of a circuit board comprising a plurality of elements each having a resistor layer formed on an insulative surface of the substrate and a pair of electrodes formed on the resistor layer at a predetermined interval, comprising: (a) a step of sequentially laminating a resistor material layer for forming the resistor layer and an electrode material layer for forming the electrodes onto the insulative surface of the substrate in this order; (b) a step of forming a resist layer (I) having a pattern for separating every element onto the electrode material layer; (c) a step of patterning the resistor material layer and the electrode material layer by dry etching on the basis of the pattern of the resist layer (I) and forming a laminated structure in which the electrode material layer has been laminated onto the resistor layer; (d) a step of removing the resist layer (I) on the laminated structure; (e) a step of forming a resist layer (II) having a pattern for forming the interval; (f) a step of patterning the electrode material layer by wet etching on the basis of the pattern of the resist layer (II), forming the interval, and forming the elements; and (g) a step of processing the surface portion of the electrode material layer so that an etching speed is made higher than that of the material forming the electrode material layer at least before the step (e).

According to the manufacturing method of the circuit board of the invention as mentioned above, it is possible to manufacture the circuit board for a liquid discharging apparatus in which coating performance of the protective layer and the cavitation resistive film on the element is excellent and durability is excellent.

The manufacturing method of the circuit board is suitable in the case where the electrode material layer is constructed by aluminum as a main component and it is desirable that the method has a step of removing aluminum oxide of the surface portion on the resist layer (II) side of the electrode material layer.

It is desirable to simultaneously execute the steps (d) and (g). It is desirable that the step (g) is a process for forming at least one selected from a fluoride, a chloride, and a nitride of the material forming the electrode material layer into the surface portion on the resist layer (II) side of the electrode material layer.

It is desirable that after the step (f), the method further has (h) a step of forming a protective layer which is thinner than the electrode material layer so as to cover at least the element.

According to the invention, there is provided a circuit board comprising: a plurality of elements each having a pair of electrodes formed at a predetermined interval onto a resistor layer formed on an insulative surface of the substrate; and a protective layer formed on the element, wherein one of a fluoride, a nitride, and a chloride of the material forming the electrodes is formed in an interface between the electrodes and the protective layer.

In the circuit board, it is desirable that at least one of the fluoride, the nitride, and the chloride of 5 at % or more exists in the interface.

According to the invention, there is provided a liquid discharging apparatus for discharging a liquid by using heat generated by an electrothermal converting element, comprising: the above circuit board; discharge ports provided in correspondence to the elements; an enclosing container for enclosing the liquid which is supplied onto the elements; and a power source circuit for supplying a power voltage to the circuit board.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 5A and 5B are cross sectional views schematically showing peripheral portions of a heat generating element of the circuit board, in which FIG. 5A is a cross sectional view of the circuit board in which coating performance of each of a protective layer and a cavitation resistive film is excellent, and FIG. 5B is a cross sectional view of the circuit board in which a structure like a hook is formed on the wiring surface and coating performance of a protective layer and a cavitation resistive film are inferior;

Figure 1:
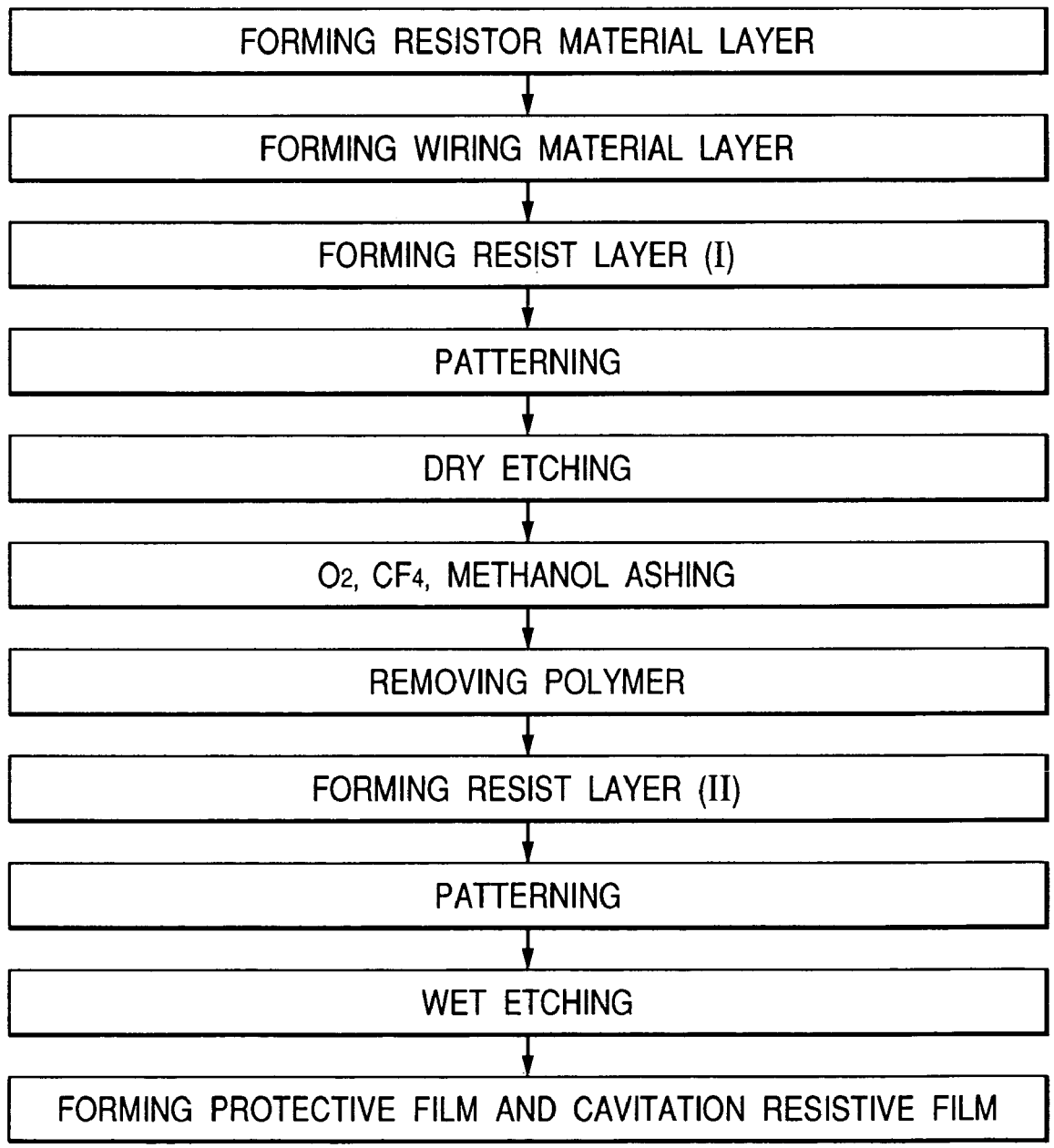
FIG. 1 is a flowchart for a manufacturing process of a circuit board in Embodiment 1 as an embodiment of the invention.

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

According to the invention, there is provided a manufacturing method of a circuit board comprising a plurality of elements each having a resistor layer formed on an insulative surface of the substrate and a pair of electrodes formed on the resistor layer at a predetermined interval, comprising: (a) a step of sequentially laminating a resistor material layer for forming the resistor layer and an electrode material layer for forming the electrodes onto the insulative surface of the substrate in this order; (b) a step of forming a resist layer (I) having a pattern for separating every element onto the electrode material layer; (c) a step of patterning the resistor material layer and the electrode material layer on the basis of the pattern of the resist layer (I) and forming a laminated structure in which the electrode material layer has been laminated onto the resistor layer; (d) a step of removing the resist layer (I) on the laminated structure; (e) a step of forming a resist layer (II) having a pattern for forming the interval; (f) a step of patterning the electrode material layer by wet etching on the basis of the pattern of the resist layer (II), forming the interval, and forming the elements; and (g) a step of processing the surface portion of the electrode material layer so that an etching speed is made higher than that of the material forming the electrode material layer at least before the step (e).

The wet etching process is preferable because a desired taper shape can be easily obtained by performing the etching by using an organic alkali etchant comprising a tetramethylammonium hydrooxide (hereinafter, abbreviated to TMAH) as a main component or an acid etchant comprising a phosphoric acid as a main component in order to allow an edge portion of the electrode in the resistor portion of the heat generating element to have the taper shape.

According to such a manufacturing method of the circuit board of the invention as mentioned above, at the time of the wet etching process to form the heat generating portion, the etching of the surface portion on the resist (II) side of the wiring layer progresses faster than the other portions. Therefore, the structure like a hood does not remain in the surface portion and the coating performance of the protective layer and the cavitation resistive film can be improved.

In the invention, for example, by properly combining one or two or more of the following methods and executing them, the surface portion on the resist layer (II) side of the target wiring layer can be formed.

(1) The steps (a) to (d) are executed in an oxygen free state.
(2) In step (d), ashing by fluorocarbon gases is executed.
(3) After the ashing in step (d), an incinerated substance of the resist layer, an Al compound of a deposit upon etching, or the like remaining in the surface portion of the wiring layer is removed.
(4) After the step (d), the oxide film in the surface portion of the wiring layer is removed.
(5) After the step (d) or simultaneously with the step (d), one of a fluoridizing process, a chloridizing process, and a nitrifying process is executed to the surface portion of the wiring layer.

As a method (1) mentioned above, for example, a method of executing the steps (a) to (d) in the vacuum, a method of executing them under an inert gas atmosphere, or the like can be mentioned.

As a method (2) mentioned above, for example, a method of executing the ashing by fluorocarbon gases such as $CF_4$—$O_2$-methanol gases, $CF_4$—$O_2$ gases, $CHF_3$ gases, $C_2F_6$ gases, $C_4F_8$ gases, or the like can be mentioned.

As a method (3) mentioned above, for example, a method of removing it by using TMAH (tetramethylammonium hydrooxide) or SST-A1 (polymer removing agent made by Tokyo Ohka Kogyo, Co., Ltd.) can be mentioned.

As a method (4) mentioned above, for example, a method of removing it by argon sputtering in the vacuum can be mentioned.

As a method (5) mentioned above, for example, a method of executing a plasma discharge processing (fluoridizing process) by $F_2$ or $CF_4$, a plasma discharge processing (chloridizing process) by $BCl_3$ or $SiHCl_3$, a plasma discharge processing (nitrifying process) by $NH_3$ or hydrazine, or the like can be mentioned.

As a material forming the wiring layer in the invention, although any material having electroconductivity can be used without particular limitation, ordinarily, metal comprising aluminum or copper as a main component is often used. Particularly, in the case of using the material comprising aluminum as a main component as a material forming the wiring layer, since there is such a tendency that the coating performance of the protective layer and the cavitation resistive film on the heat generating element deteriorates in the prior art, an effect according to the invention is large. For example, Al, Al—Cu, Al—Si—Cu, Al—Si, Al—Ta, or the like can be mentioned as such a material. The "main component" denotes a largest quantity of component contained in the material. When a thickness of wiring layer is equal to 200 to 15,000 nm, the invention can be more preferably used.

If the wiring layer is made of the material comprising aluminum as a main component, the structure like a hood mentioned above is made of aluminum oxide formed when the surface portion on the resist layer (II) side of the wiring layer is oxidized. In other words, when no aluminum oxide exists in the surface portion or when the aluminum oxide exists and a quantity of the area of the aluminum oxide is less than 95 at % of that of the surface portion on the resist (II) side of the wiring layer, an etching speed of the surface portion on the resist layer (II) side of the wiring layer in step (f) is higher than that of the material forming the wiring layer. This is a preferable embodiment. "at %" denotes "atomic %" which is obtained by an analysis using XPS or SIMS.

Further, if the protective layer which is formed so as to cover the element is thinner than the electrode material layer, since there is such a tendency that the coating performance of the protective layer and the cavitation resistive film on the heat generating element deteriorates in the prior art, the effect according to the invention is large.

The "wiring layer" is obtained by forming a pair of electrodes by patterning and also functions as a wiring for energizing an interval across the electrodes.

EMBODIMENTS

Embodiment 1

Figure 2A:
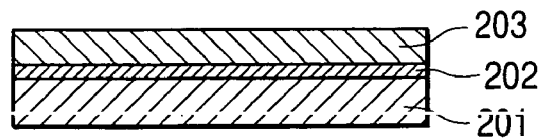
FIGS. 2A, 2B, 2C, 2D, 2E, 2F and 2G are cross sectional views during the processes in Embodiment 1.
Figure 2B:
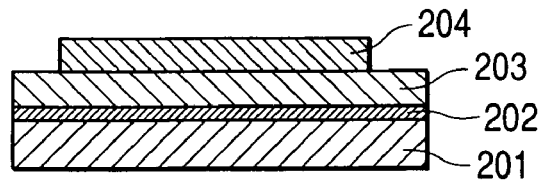
Figure 2C:
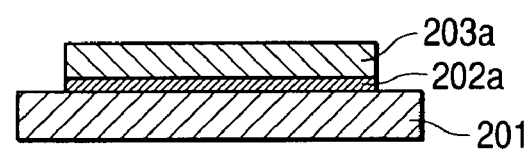
Figure 2D:
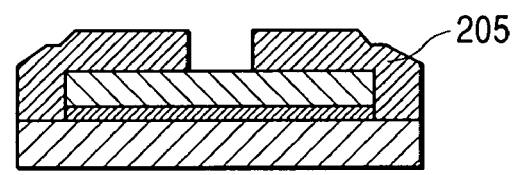
Figure 2E:
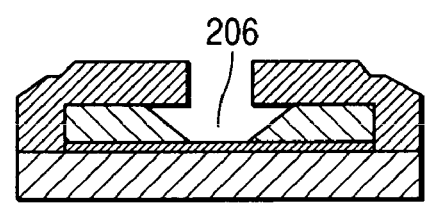
Figure 2F:
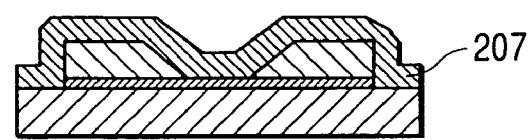
Figure 2G:
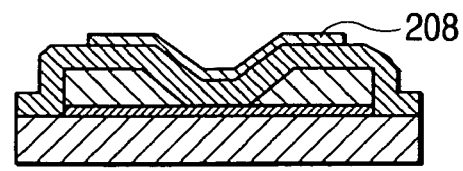

FIG. 1 is a flowchart for a manufacturing process of a circuit board in Embodiment 1. FIGS. 2A to 2G are schematic cross sectional views during the processes. First, an Si wafer is used as a substrate and an oxide layer of $SiO_2$ is formed as an insulative surface 201 having a thickness of about a few μm onto the Si wafer by thermal oxidation. A TaSiN film having a thickness of 50 nm is further formed as a resistor material layer 202 onto the oxide layer by sputtering. After that, an Al film containing 0.5 mass % Cu and having a thickness of 600 nm is formed as an electrode material layer 203 (FIG. 2A). Subsequently, a resist layer (I) 204 is formed on the electrode material layer 203 and patterned (FIG. 2B). Thereafter, the electrode material layer and the resistor material layer are dry-etched by the RIE, thereby separating the element and forming a wiring layer 203a and a resistor layer 202a (FIG. 2C). After that, the resist layer (I) is removed by plasma ashing using $CF_4$, $O_2$, or methanol gas. At this time, an aluminum fluoride is partially formed on the wiring layer surface in accordance with ashing conditions (not shown). After that, an incinerated substance of the resist layer (I), an Al compound of a deposit upon etching, or the like remaining on the wiring layer surface is removed by using TMAH (tetramethylammonium hydrooxide). Subsequently, a resist (II) 205 is formed and patterned (FIG. 2D). After that, the wiring layer serving as a heat generating portion 206 of the heat generating element is removed by wet etching (FIG. 2E). An organic alkali etchant comprising TMAH as a main component is used as a wet etchant. Since the aluminum fluoride has been formed on the wiring layer surface, the wiring layer is quickly etched. The formed edge portions of the pair of electrodes become a structure having the taper shape and the structure like a hood was not found. Even by removing the incinerated substance of the resist layer (I), the Al compound of the deposit upon etching, or the like, no hood was formed or a degree of creation of the hood could be reduced as compared with that in the case where they are not removed. Subsequently, after the resist (II) was removed, an SiN film having a thickness of 300 nm is formed as a protective layer 207 by the plasma CVD method (FIG. 2F). A Ta film is further formed onto the protective layer 207 as a cavitation resistive film 208 by sputtering. By removing unnecessary portions of the cavitation resistive film by the dry etching method, a circuit board is obtained (FIG. 2G). The coating performance of each of the protective layer and the cavitation resistive film on the heat generating element of the manufactured circuit board is excellent.

Embodiment 2

Figure 3:
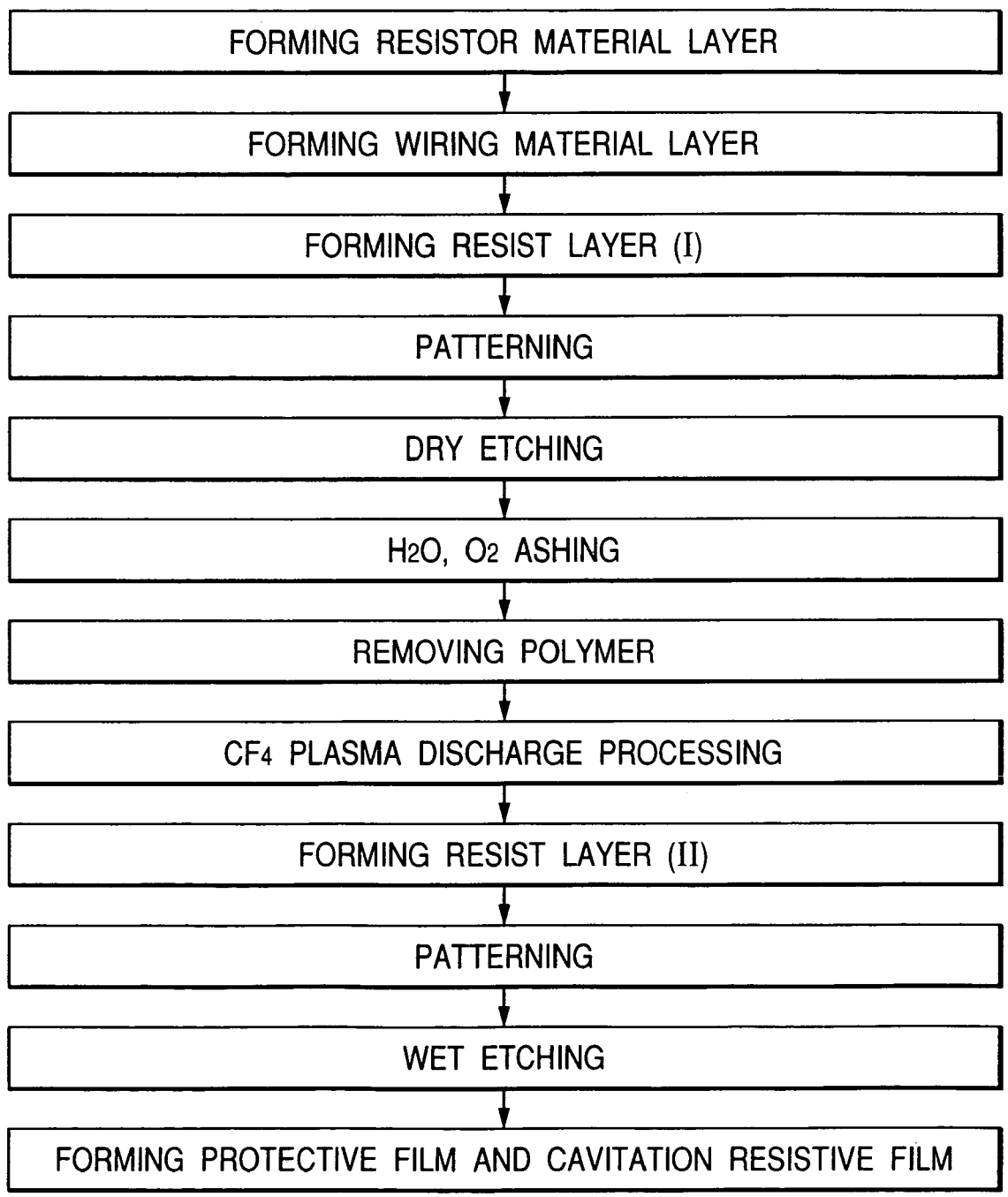
FIG. 3 is a flowchart for a manufacturing process of a circuit board in Embodiment 2 as an embodiment of the invention.

FIG. 3 is a flowchart for a manufacturing process of a circuit board in Embodiment 2. First, an oxide layer, a resistor material layer, and an electrode material layer are formed on an Si substrate in a manner similar to Embodiment 1. The resist (I) is formed onto the electrode material layer and patterned. Thereafter, the element is separated by the RIE and the electrode material layer and the resistor material layer are dry-etched, thereby forming a wiring layer and a resistor layer. After that, the resist layer (I) is removed by ashing by $H_2O$ and/or $O_2$. At this time, an aluminum oxide has been formed on the wiring layer surface. After that, the incinerated substance of the resist layer (I), the Al compound of the deposit upon etching, or the like remaining on the wiring layer surface is removed by polymer removing agent (such as SST-A1, made by Tokyo Ohka Kogyo, Co., Ltd.). Subsequently, the aluminum oxide on the wiring layer surface is removed by using argon sputtering in the vacuum. After that, the aluminum fluoride is formed on the wiring layer surface by plasma-discharging $CF_4$. According to the present method, the wiring layer surface can be more uniformly fluoridized than Embodiment 1. Subsequently, the resist layer (II) is formed and patterned. After that, the wiring layer serving as a heat generating portion of the heat generating element is removed by wet etching. The formed edge portions of the pair of electrodes have the taper shape in a manner similar to Embodiment 1 and the structure like a hood was not found. An organic alkali etchant comprising TMAH as a main component is used as a wet etchant. Subsequently, a protective layer consisting of SiN and having a thickness of 300 nm is formed by the plasma CVD method. A cavitation resistive film consisting of Ta is further formed onto the protective layer by sputtering. By removing unnecessary portions of the cavitation resistive film by the dry etching method, a circuit board is obtained. The coating performance of each of the protective layer and the cavitation resistive film on the heat generating element of the manufactured circuit board is excellent.

Embodiment 3

Figure 4:
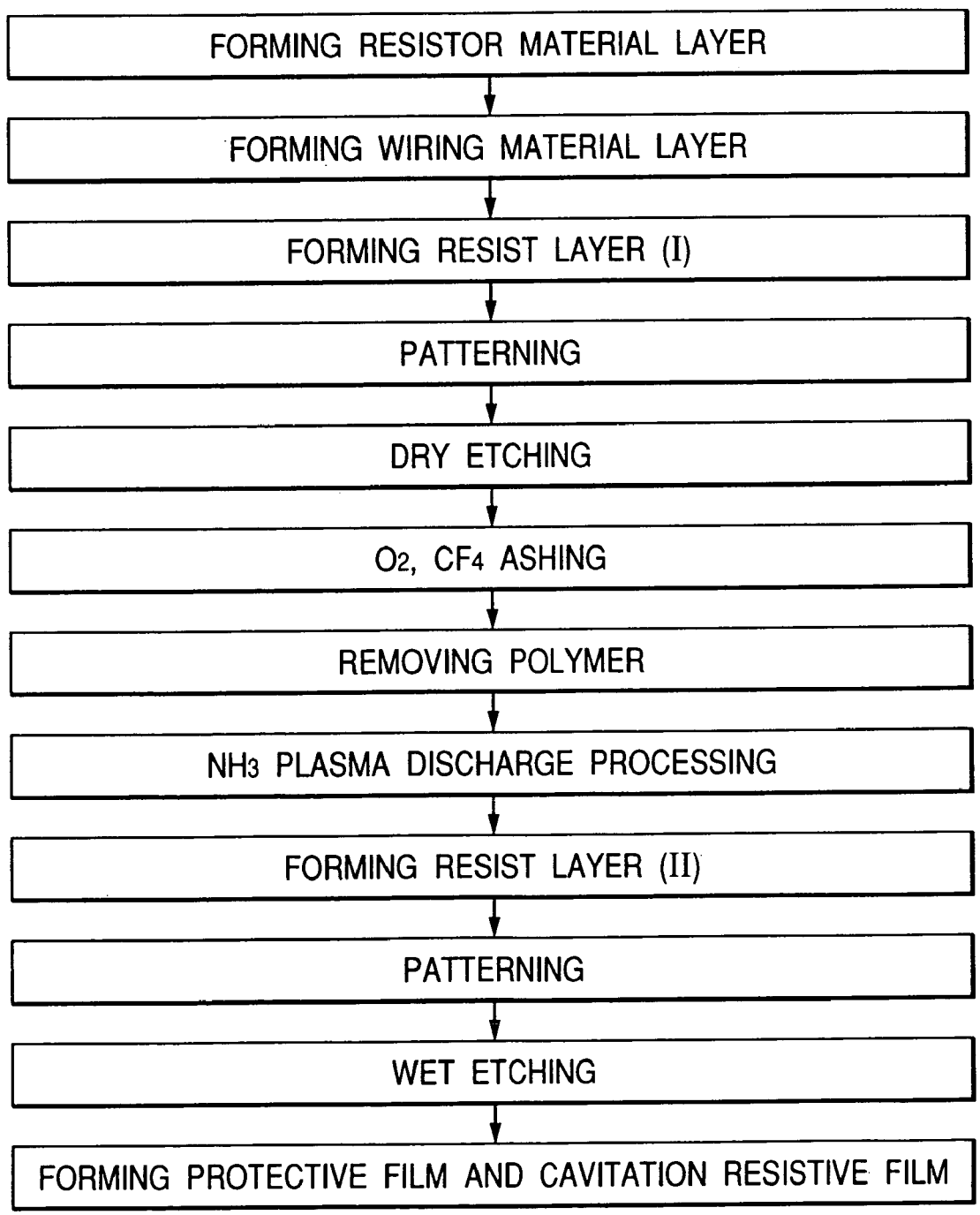
FIG. 4 is a flowchart for a manufacturing process of a circuit board in Embodiment 3 as an embodiment of the invention.
Figure 5A:
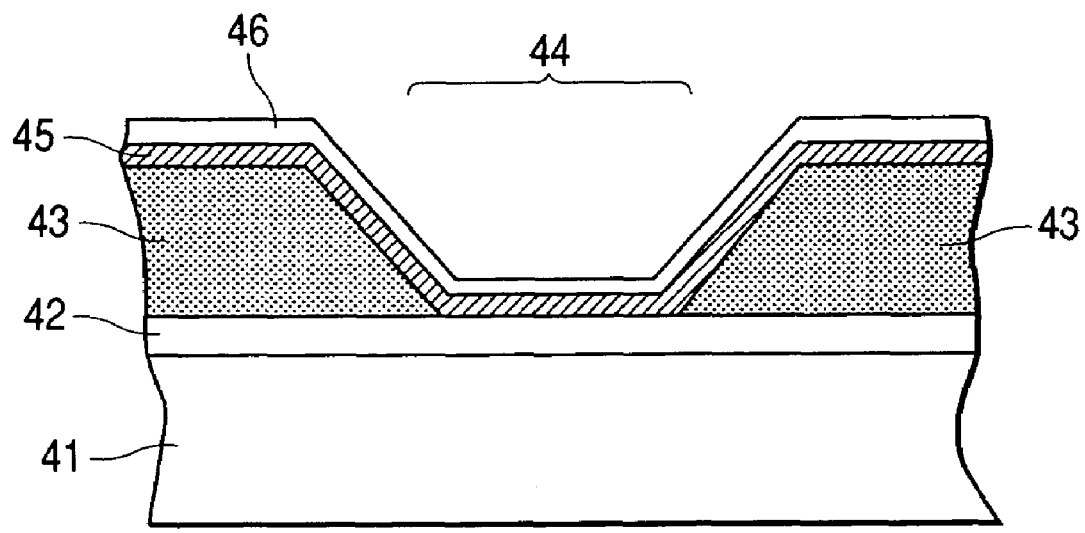
Figure 5B:
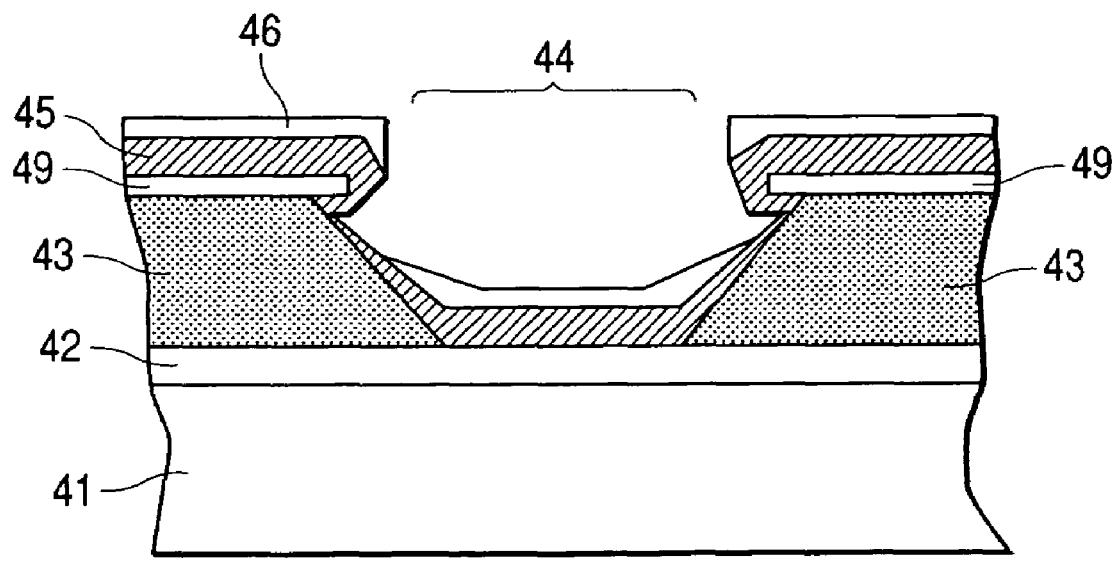

FIG. 4 is a flowchart for a manufacturing process of a circuit board in Embodiment 3. First, an oxide layer, a resistor material layer, and an electrode material layer are formed on an Si substrate in a manner similar to Embodiment 1. The resist (I) is formed onto the electrode material layer and patterned. Thereafter, the electrode material layer and the resistor material layer are dry-etched by the RIE and the element is separated, thereby forming a wiring layer and a resistor layer. After that, the resist layer (I) is removed by ashing by the $O_2$ and/or $CF_4$ gas. At this time, an aluminum fluoride has been formed on the wiring layer surface. After that, the incinerated substance of the resist layer (I), the Al compound of the deposit upon etching, or the like remaining on the wiring layer surface is removed by polymer removing agent (such as SST-A1, made by Tokyo Ohka Kogyo, Co., Ltd.). Subsequently, an aluminum nitride is formed on the wiring layer surface by plasma-discharging $NH_3$. At this time, the aluminum nitride formed on the wiring layer surface is not dissolved by water of a quantity existing in the atmosphere. Subsequently, the resist layer (II) is formed and patterned. After that, the wiring layer serving as a heat generating portion of the heat generating element is removed by wet etching. An organic alkali etchant comprising TMAH as a main component is used as a wet etchant. At this time, since the aluminum nitride is etched faster than aluminum, the formed edge portions of the pair of electrodes have the taper shape and the structure like a hood was not found. Subsequently, a protective layer consisting of SiN and having a thickness of 300 nm is formed by the plasma CVD method. A cavitation resistive film consisting of Ta is further formed onto the protective layer by sputtering. By removing unnecessary portions of the cavitation resistive film by the dry etching method, a circuit board is obtained. The coating performance of each of the protective layer and the cavitation resistive film on the heat generating element of the manufactured circuit board is excellent.

COMPARISON EXAMPLE

Figure 6:
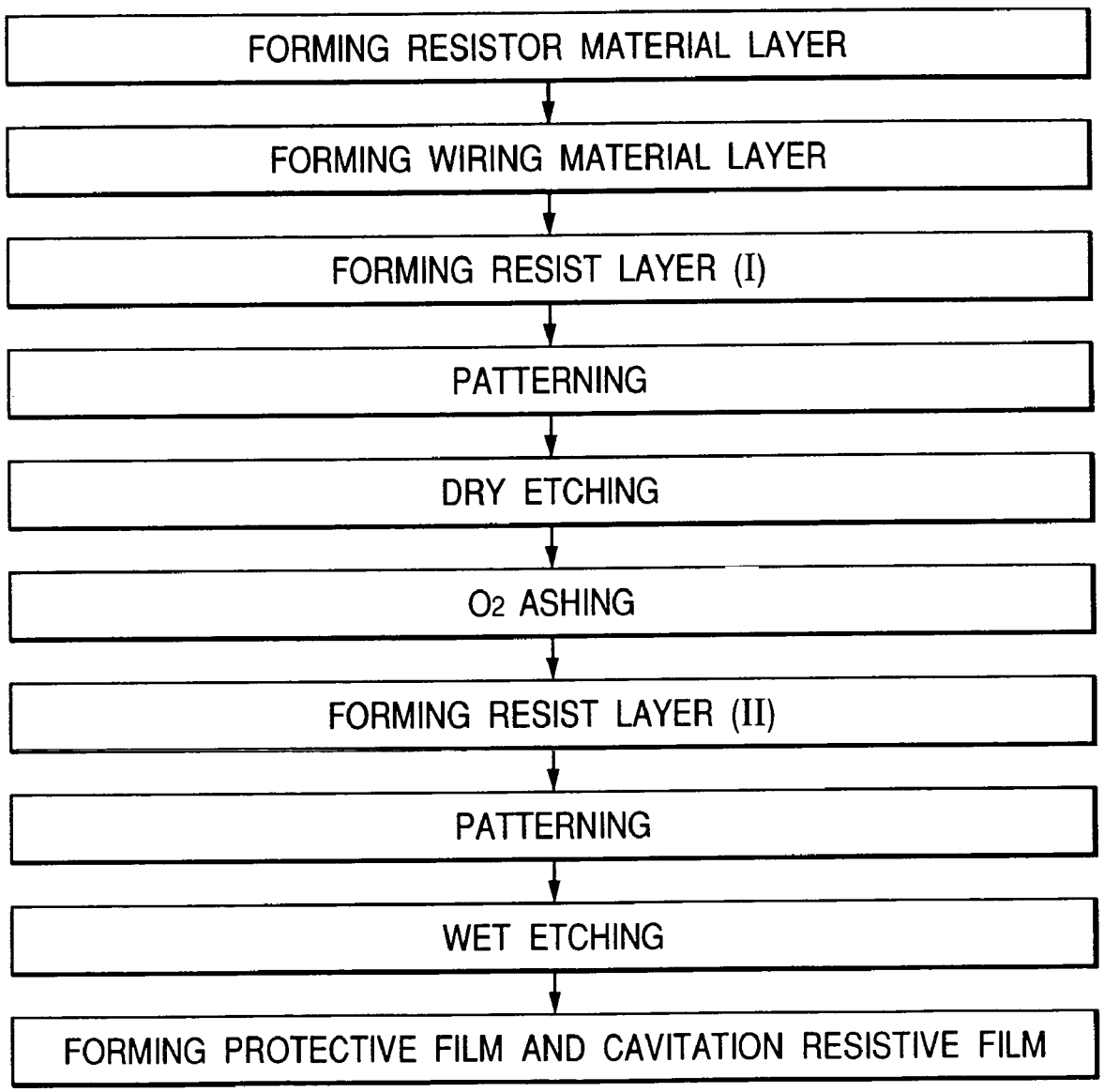
FIG. 6 is a flowchart for a manufacturing process of a conventional circuit board.
Figure 7:
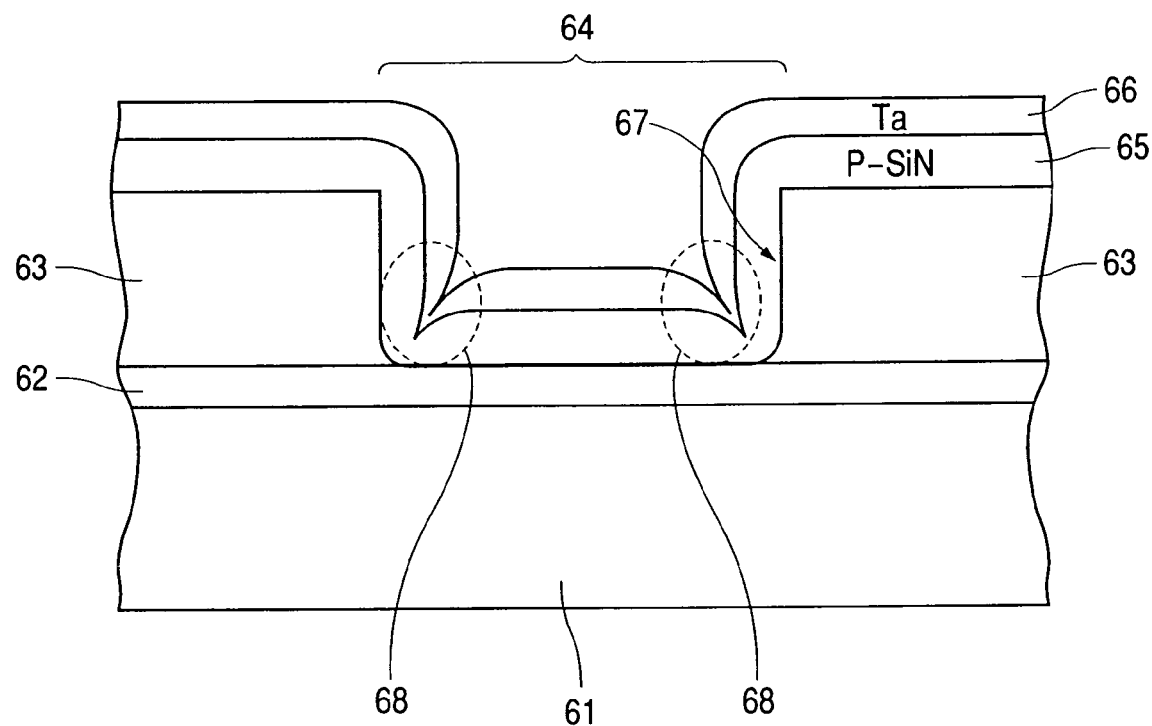
FIG. 7 is a cross sectional view showing a structure of peripheral portions of a heat generating element of the conventional circuit board.

A circuit board is manufactured by a processing flow of a manufacturing process shown in FIG. 6 as a manufacturing method of the conventional circuit board. First, an oxide layer, a resistor material layer, and an electrode material layer are formed on an Si substrate in a manner similar to Embodiment 1. The resist (I) is formed onto the electrode material layer and patterned. Thereafter, the electrode material layer and the resistor material layer are dry-etched by the RIE and the element is separated, thereby forming a wiring layer and a resistor layer. After that, the resist layer (I) is removed by ashing by the $O_2$ gas. At this time, an aluminum oxide has been formed on the wiring layer surface. Subsequently, the resist layer (II) is formed and patterned. After that, the wiring layer serving as a heat generating portion of the heat generating element is removed by wet etching. An organic alkali etchant comprising TMAH as a main component is used as a wet etchant. Subsequently, a protective layer consisting of SiN and having a thickness of 300 nm is formed by the plasma CVD method. A cavitation resistive film consisting of Ta is further formed onto the protective layer by sputtering. By removing unnecessary portions of the cavitation resistive film by the dry etching method, a circuit board is obtained.

Table 1 shows comparison and evaluation results of ink durability in the circuit boards manufactured in Embodiments 1 to 3 and Comparison example. A testing method is as follows. The circuit board is assembled to the liquid discharge head, the ink discharge is executed 10,000 times under harder condition than usual (normal) one, and thereafter, the number of disconnection times of the heat generating element on each circuit board is examined. In each method, each denominator is set to 100,000 resistors.

TABLE 1

|  | Embodiment 1 | Embodiment 2 | Embodiment 3 | Comparison example |
|---|---|---|---|---|
| The number of disconnections | 10 | 3 | 0 | 250 |

In all of Embodiments 1 to 3, the number of disconnection times is extremely improved and, further, the durability is more excellent as compared with that of Comparison example.

By changing the ashing conditions or polymer removing method in Embodiment 1, an area ratio of the aluminum fluoride and the aluminum oxide on the Al surface can be changed. If the 5 at % or more aluminum fluoride exists on the Al surface, the ink durability is improved.

In Embodiments 1 to 3, Al containing 0.5 mass % Cu is used and the film thickness of wiring layer is set to 600 nm. However, a similar effect is also obtained in the case where the wiring layer is formed by using the material containing Al such as Al—Si—Cu, Al—Si, Al—Ta, or the like. A similar effect is also obtained in the case where the wiring layer is formed by Cu and the fluoridizing process or the like is executed to the wiring layer surface. It is effective when the film thickness of wiring layer lies within a range from 200 to 15,000 nm.

Further, when the film thickness of protective layer is thinner than that of the wiring layer, since the coating performance largely deteriorates in the manufacturing method of the Comparison example, it is effective. Particularly, when a ratio of the wiring layer/the protective layer is equal to 1 to 2, the process of the invention is effective. When it is equal to 1.5, the effect is the largest.

Moreover, in this invention, it is preferable that one of a fluoride, a nitride, and a chloride of the material forming the electrodes is formed in an interface between the electrodes and the protective layer. The fluoride of the material forming the electrodes is the most preferable. It is because, as for a fluoride, when moisture is present, corrosion does not occur as easily as in the case of a chloride, the solubility in water is high and it is easy to perform taper etching, and, since generation energy is low, it is easier to form compared with a nitride.

(Liquid Discharging Apparatus)

According to the liquid discharge head of the embodiment of the invention, for example, in order to form the discharge port and a liquid path which communicates therewith into the circuit board according to each of the foregoing embodiments, such a head can be manufactured by combining a discharge port forming member such as a top plate or the like made of a molding resin, a film, or the like. If a container in which the ink is contained is connected and mounted to a printer main body, a power voltage is supplied from a power supply circuit of the main body, and image data is supplied to the head from the image processing circuit, the apparatus operates as an ink jet printer.

Figure 8:
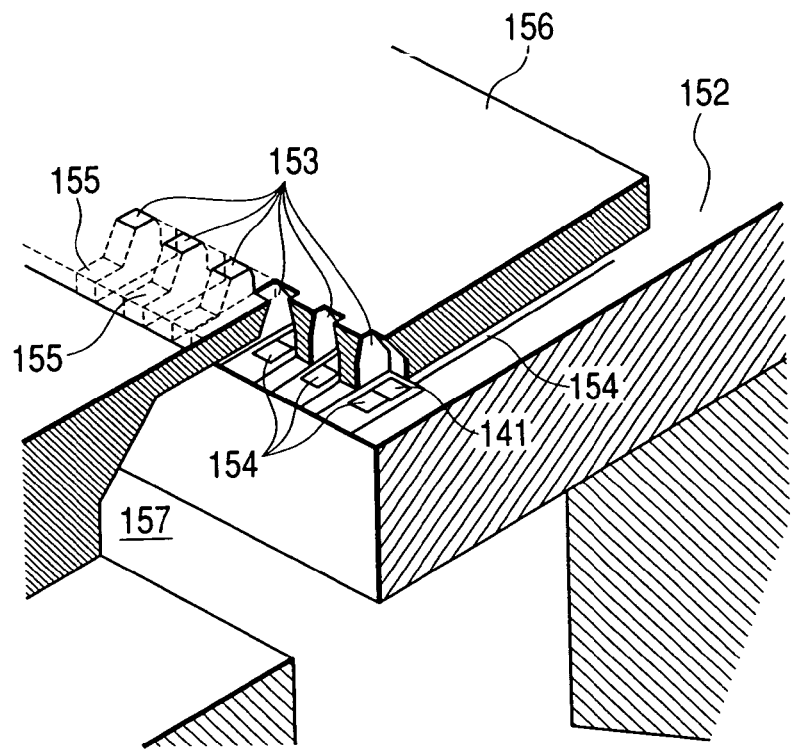
FIG. 8 is a diagram showing a part of a construction of a liquid discharge head using the circuit board of the invention.

FIG. 8 is a diagram for explaining an embodiment of the liquid discharge head of the invention and shows a part of the liquid discharge head.

A plurality of electrothermal converting elements 141 each of which generates heat by receiving an electric signal in which a current flows and discharges the ink from a discharge port 153 by a bubble that is generated by the heat are arranged in a column shape onto a circuit board 152 of the invention. A wiring electrode 154 for supplying the electric signal for driving each electrothermal converting element is provided for each electrothermal converting element. One end side of the wiring electrode is electrically connected to a switching element (not shown).

A flow path 155 for supplying the ink to the discharge port 153 provided in a position which faces the electrothermal converting element 141 is provided in correspondence to each discharge port 153. Walls constructing the discharge ports 153 and the flow paths 155 are provided for members 156 with grooves. By connecting the members 156 with grooves to the circuit board 152, the flow paths 155 and a common liquid chamber 157 for supplying the ink to a plurality of flow paths are provided.

Figure 9:
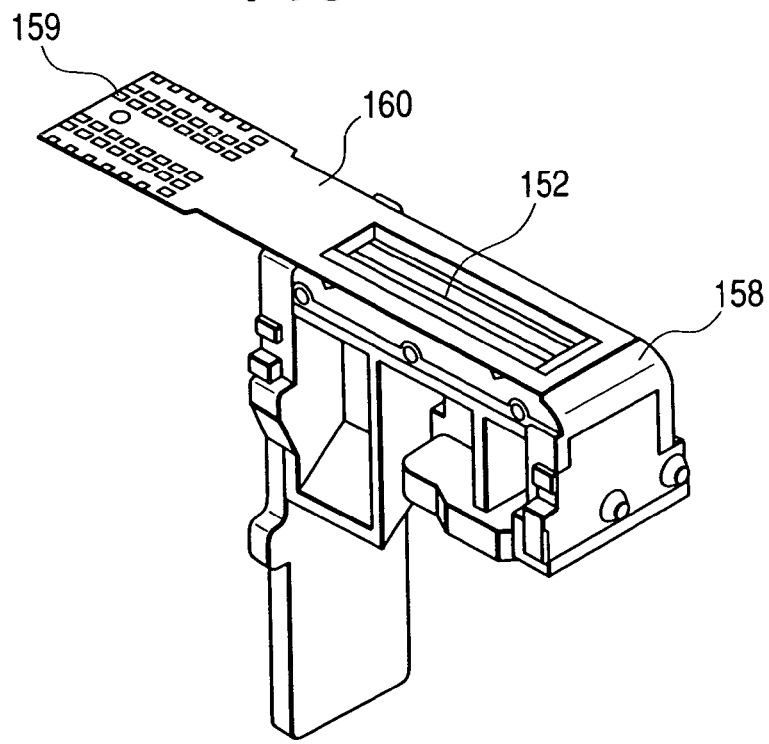
FIG. 9 is a diagram showing a structure of the liquid discharge head using the circuit board of the invention.

FIG. 9 shows a structure of the liquid discharge head in which the circuit board 152 of the invention has been assembled. The circuit board 152 of the invention has been assembled in a frame body 158. The members 156 with grooves constructing the discharge ports 153 and the flow paths 155 are attached onto the circuit board 152. Contact pads 159 for receiving the electric signals from the apparatus side are provided. The electric signals serving as various driving signals are supplied from a controller of the apparatus main body to a circuit which the circuit board 152 has via a flexible printed wiring board 160.

Figure 10:
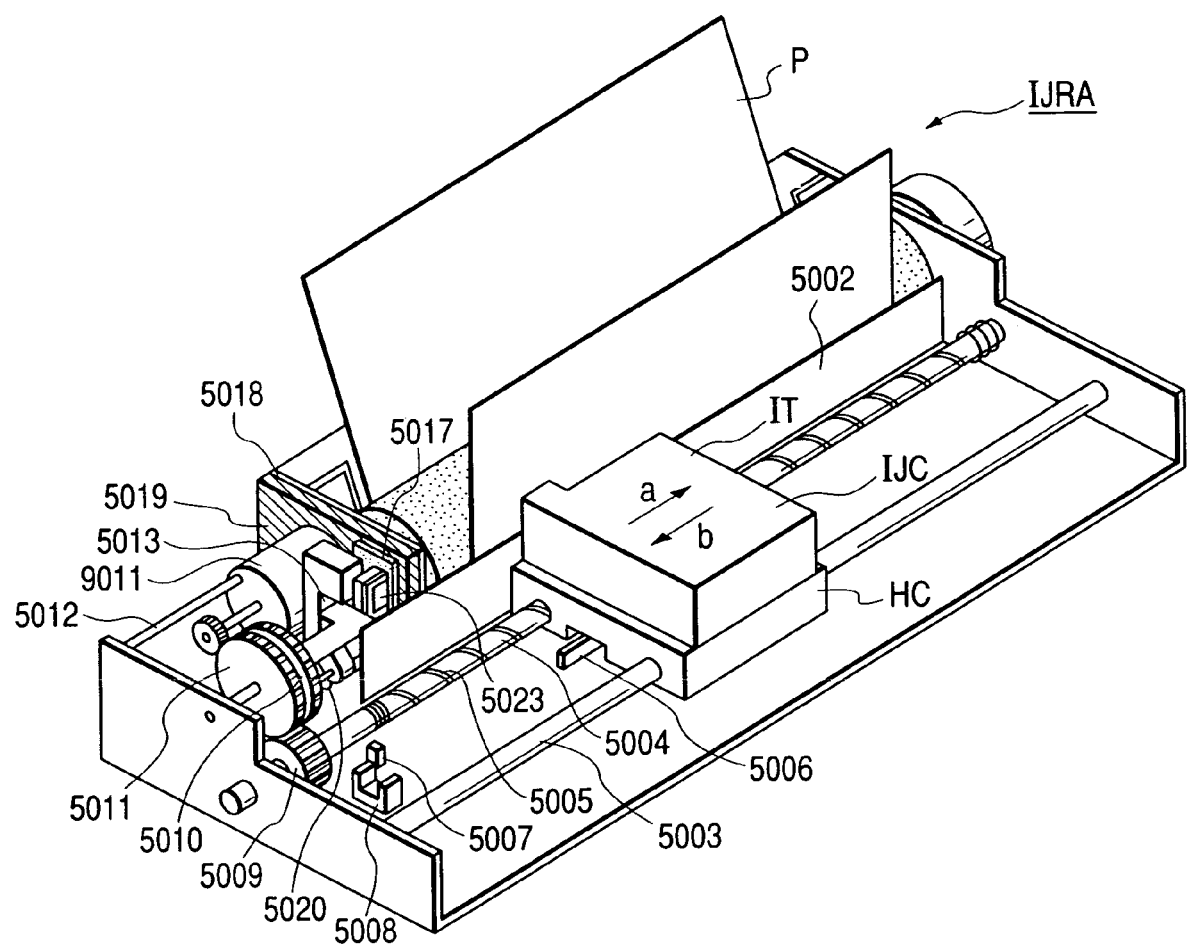
FIG. 10 is a diagram showing an outline of a liquid discharging apparatus to which the liquid discharge head using the circuit board of the invention is applied.

FIG. 10 is a diagram for explaining an embodiment of the liquid discharging apparatus to which the liquid discharge head of the invention is applied. FIG. 10 shows an outline of an ink jet recording apparatus IJRA.

A lead screw 5005 is rotated via driving force propagating gears 5011 and 5009 in association with the forward/backward rotation of a driving motor 9011. A carriage HC, which engages a spiral groove 5004 of the lead screw 5005, has a pin (not shown) and is reciprocated in the directions shown by arrows a and b.

Reference numeral 5002 denotes a paper pressing plate for pressing paper onto a platen serving as recording medium conveying means in the carriage moving direction; and 5007 and 5008 indicate photocouplers as home position detecting means each for confirming the existence of a lever 5006 of the carriage in a sensing area of the photocoupler and executing a switching operation or the like of the rotating direction of the driving motor 9011. A member to support a cap member for capping a front surface of a recording head is provided. Reference numeral 5013 denotes a sucking means for sucking the air in the cap. The sucking means 5013 executes a sucking recovery of the recording head via an opening 5023 in the cap. Reference numeral 5017 denotes a cleaning blade and 5019 indicates a member for enabling the cleaning blade to be moved in the front/rear directions. The cleaning blade 5017 and the member 5019 are supported to a body supporting plate 5018. Naturally, the cleaning blade is not limited to the blade shown in this example, and another well-known cleaning blade can be applied to the invention. Reference numeral 5012 denotes a lever to start the sucking of the sucking recovery. The lever is moved in association with a movement of a cam 5020, which engages the carriage. A driving force from the driving motor is transferred by well-known transfer means such as a clutch switch or the like.

Although the apparatus is constructed so that when the carriage reaches an area on the home position side, a desired one of the capping, cleaning, and sucking recovery processes can be executed at a position corresponding to each means by the operation of the lead screw 5005, the invention can be applied to any control method so long as a desired operation is executed at well-known timing. Each of the above constructions is the excellent invention solely or as a combination thereof and the preferable constructional examples to the invention are shown.

The apparatus has controller driving signal supplying means (not shown) comprising an electric circuit for supplying the power voltage, image signal, drive control signal, and the like to the circuit board 152.

The invention is not limited to the foregoing various embodiments but, naturally, the component elements of the invention can be replaced with substitutions or equivalent elements so long as they can solve the foregoing problems.

What is claimed is:

1. A circuit board comprising:
    a plurality of elements with each element having a pair of electrodes formed at a predetermined interval onto a resistor layer formed on an insulative surface of a substrate; and
    a protective layer formed on the element,
    wherein one of the electrodes comprises a fluoride, a nitride or a chloride, which is present at an interface between the one of the electrodes and the protective layer.

2. The circuit board according to claim 1, wherein a content of the fluoride, the nitride or the chloride at the interface is at least 5 at %.

3. The circuit board according to claim 1, wherein a ratio of thicknesses of the protective layer and a wiring layer is set to $1 \leqq$ the wiring layer/the protective layer $\leqq 2$.

* * * * *